United States Patent
Wadsworth et al.

(10) Patent No.: US 6,590,197 B2
(45) Date of Patent: Jul. 8, 2003

(54) FABRICATING A HYBRID IMAGING DEVICE

(75) Inventors: Mark Wadsworth, Sierra Madve, CA (US); Gene Atlas, Carlsbad, CA (US)

(73) Assignee: California Institute of Technology, Pasadena, CA (US)

( * ) Notice: Subject to any disclaimer, the term of this patent is extended or adjusted under 35 U.S.C. 154(b) by 25 days.

(21) Appl. No.: 09/978,621

(22) Filed: Oct. 15, 2001

(65) Prior Publication Data

US 2002/0020801 A1 Feb. 21, 2002

Related U.S. Application Data

(62) Division of application No. 09/437,328, filed on Nov. 9, 1999, now Pat. No. 6,303,923.
(60) Provisional application No. 60/112,880, filed on Dec. 18, 1998.

(51) Int. Cl.[7] .................................................. H01L 27/00
(52) U.S. Cl. .................................. 250/208.1; 250/214 R
(58) Field of Search ........................ 250/208.1, 214 LA, 250/214 A, 214 R, 370.14, 370.08; 257/291, 294, 299, 440; 348/308, 309, 311, 302

(56) References Cited

U.S. PATENT DOCUMENTS 5,149,956 A * 9/1992 Norton ........................ 250/226
5,449,908 A * 9/1995 Wadsworth et al. ......... 250/332
5,708,263 A * 1/1998 Wong ....................... 250/208.1

* cited by examiner

Primary Examiner—Que T. Le
(74) Attorney, Agent, or Firm—Fish & Richardson P.C.

(57) ABSTRACT

A hybrid detector or imager includes two substrates fabricated under incompatible processes. An array of detectors, such as charged-coupled devices, are formed on the first substrate using a CCD fabrication process, such as a buried channel or peristaltic process. One or more charge-converting amplifiers are formed on a second substrate using a CMOS fabrication process. The two substrates are then bonded together to form a hybrid detector.

11 Claims, 4 Drawing Sheets

FABRICATING A HYBRID IMAGING DEVICE

CROSS-REFERENCE TO RELATED APPLICATIONS

This is is a divisional of U.S. application Ser. No. 09/437,328, filed Nov. 9, 1999 now U.S. Pat. No. 6,303,923, which claims the benefit of U.S. Provisional Application 60/112,880, filed Dec. 18, 1998.

STATEMENT AS TO FEDERALLY SPONSORED RESEARCH

The invention described herein was made in the performance of work under a NASA contract, and is subject to the provisions of Public Law 96-517 (35 USC 202) in which the Contractor has elected to retain title.

TECHNOLOGICAL FIELD

This application relates to fabricating a device for use in detecting or imaging electromagnetic radiation, such as photons of light.

BACKGROUND

Many scientific endeavors, especially space exploration and astronomical measurement applications, require highly sensitive electromagnetic radiation detectors, such as photon detectors. Charge-coupled detectors (CCDs) provide high quantum efficiency, broad spectral response, low readout noise, and high resolution. Therefore, CCD devices have been used extensively in scientific applications.

To be effective for most scientific applications, CCD devices must exhibit nearly perfect charge-transfer efficiency. Therefore, CCD devices are fabricated using specialized processes, such as the buried channel and peristaltic fabrication processes, which leave little, if any, imperfections in the semiconductor materials from which the CCD devices are formed. The CCD devices produced by these processes are generally characterized by high power consumption.

Other imaging devices, such as charge injection devices (CIDs) and active pixel sensors (APSs), are formed using conventional complementary metal-oxide semiconductor (CMOS) processes. CMOS devices typically exhibit much lower power consumption than CCD devices. Moreover, CMOS fabrication processes allow other imaging components, such as signal-processing circuitry, to be formed on the detector chip. As a result, CMOS imagers are preferred over CCDs in some scientific applications. The use of CMOS imagers has been limited, however, by characteristically low quantum efficiencies and high levels of fixed pattern noise in captured images.

In general, the fabrication processes used to produce CCD and CMOS imagers are incompatible. Conventional CMOS fabrication processes occur, at least in part, at temperatures that produce imperfections in the underlying semiconductor materials. While generally acceptable in CMOS devices, these imperfections typically reduce the efficiency of CCD devices to unacceptable levels.

SUMMARY

The techniques described here combine benefits of CCD and CMOS devices without integrating CCD and CMOS fabrication process technologies. The resulting detectors and imagers exhibit the performance benefits of CCD devices, including high quantum efficiency, high fill factor, broad spectral response, and very low noise levels, as well as the low power consumption and ease of component integration associated with CMOS devices.

Because the CCD and CMOS portions of an imaging device are manufactured in separate processes using separate substrates, the CCD and CMOS portions can be tuned separately for optimum noise performance. Moreover, fabricating the CCD and CMOS components from separate substrates allows the use of backside thinning and illumination techniques, as well as backside passivation techniques such as delta doping.

In some aspects, the invention features techniques for fabricating a radiation detector, such as an imaging device. An array of detectors, such as charged-coupled devices, are formed on a first substrate using a CCD fabrication process, such as a buried channel or peristaltic process. One or more charge-converting amplifiers are formed on a second substrate, typically using a CMOS fabrication process. The two substrates are then bonded together to form a hybrid detector.

Other embodiments and advantages will become apparent from the following description and from the claims.

DETAILED DESCRIPTION

Figure 1:
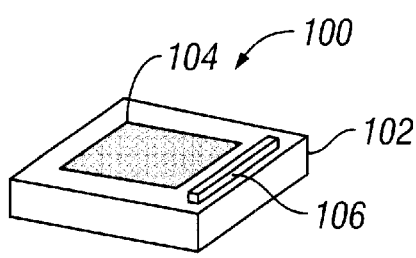
FIG. 1 is a perspective view of a hybrid radiation imaging chip that includes both CCD and CMOS components.

FIG. 1 shows a perspective view of a hybrid CCD-CMOS imaging chip 100. The imaging chip includes a substrate 102 that has a CCD array 104 formed on one surface by a conventional CCD fabrication process, such as a buried channel or peristaltic process. A conventional CCD device includes a buried-channel amplifier in the CCD substrate that converts charge collected in the CCD array into voltage-mode signals. The CCD portion of the hybrid chip 100 does not include such an amplifier.

A CMOS-based gain stage is formed on another substrate 106 by a conventional CMOS fabrication process. This gain stage replaces the buried-channel amplifier normally formed on a CCD chip. As described below, the two substrates 102, 106 are bonded together after the CCD and CMOS circuits are formed. This eliminates any need to integrate the CCD and CMOS fabrication processes together. In many implementations, signal processing electronics can be formed on the CMOS substrate 106 to provide full imaging capability on the hybrid chip 100.

Figure 2:
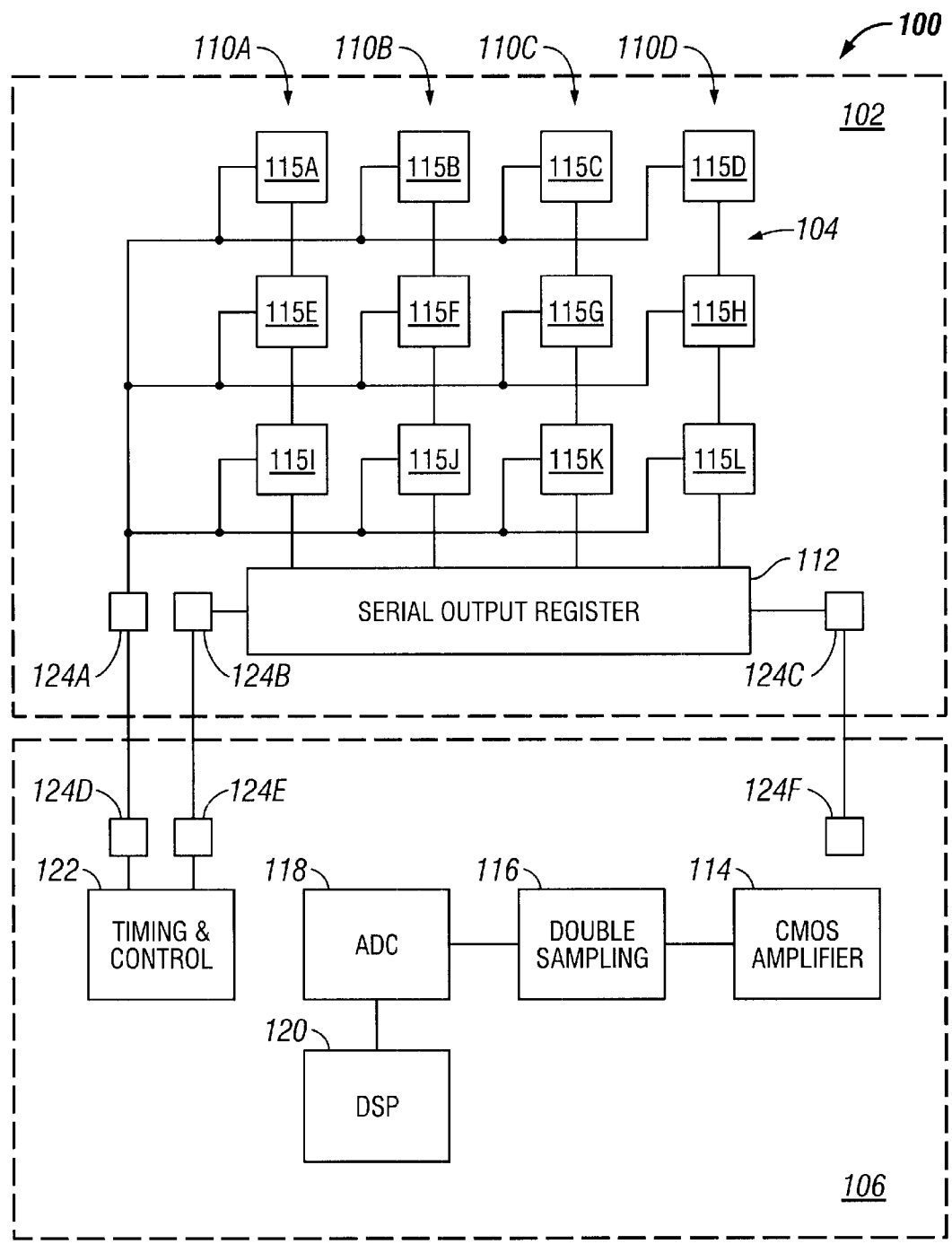
FIG. 2 is a schematic diagram of a hybrid radiation imaging chip that includes both CCD and CMOS components.

FIG. 2 shows a block diagram of the hybrid imaging chip 100. The CCD substrate 102 includes individual detector elements 115A–L, or "pixels," arranged as a CCD array 104. As in a conventional CCD imaging device, the array 104 includes one or more lines 110A–D (rows or columns) of CCDs coupled to a high-speed serial register 112. Upon exposure to electromagnetic radiation, the pixels 115A–L collect charge in capacitively coupled potential wells formed in a semiconductor layer, such as an epitaxial silicon layer. Optically transparent control gates formed on the image area hold the collected charge in the potential wells. The pixels 115A–L transfer the collected charge along the lines 110A–D to the high-speed serial register 112 in response to a series of pulses applied to the control gates.

The high-speed serial register 112 on the CCD substrate 102 is coupled to a CMOS charge-mode amplifier 114 formed on the CMOS substrate 106. In one implementation, the charge-mode amplifier 114 is an operational amplifier configured as a charge integrator. This amplifier 114 can lower the noise during charge collection. Because the CMOS charge-mode amplifier 114 is not formed on the substrate 102 on which the imaging array 104 is formed, the amplifier 114 is not subject to size constraints. As a result, the amplifier 114 can include components that are sized to yield optimum 1/f and thermal noise performance. Thus, the amplifier 114 can outperform amplifiers found in conventional CMOS imaging devices, such as CID and APS devices. Because the amplifier 114 is a CMOS device, it also consumes very little power, typically an order of magnitude less than conventional CCD amplifiers.

In some implementations, the CMOS substrate 106 also includes CMOS signal processing circuitry, such as a double-sampling circuit 116, an analog-to-digital converter (ADC) 118, and a digital signal processor (DSP) 120. These components provide noise reduction and image processing capability on the hybrid imaging chip 100. The CMOS substrate 106 also includes timing and control circuitry 122 that controls the transfer of charge from the pixels 115A–L in the array 104 to the high-speed serial register 112. In a conventional CCD imaging device, the timing and control circuitry is often formed on a separate chip.

In some implementations, the CCD and CMOS components are coupled by electrically conductive pads 124A–F formed on the CCD substrate 102 and the CMOS substrate 106. These pads 124A–F are aligned to allow mechanical and electrical interconnection of the substrates 102, 106. A conventional flip-chip technique using an infrared (IR) microscope and alignment marks on the CCD and CMOS substrates can be used to align the substrates.

Figure 3:
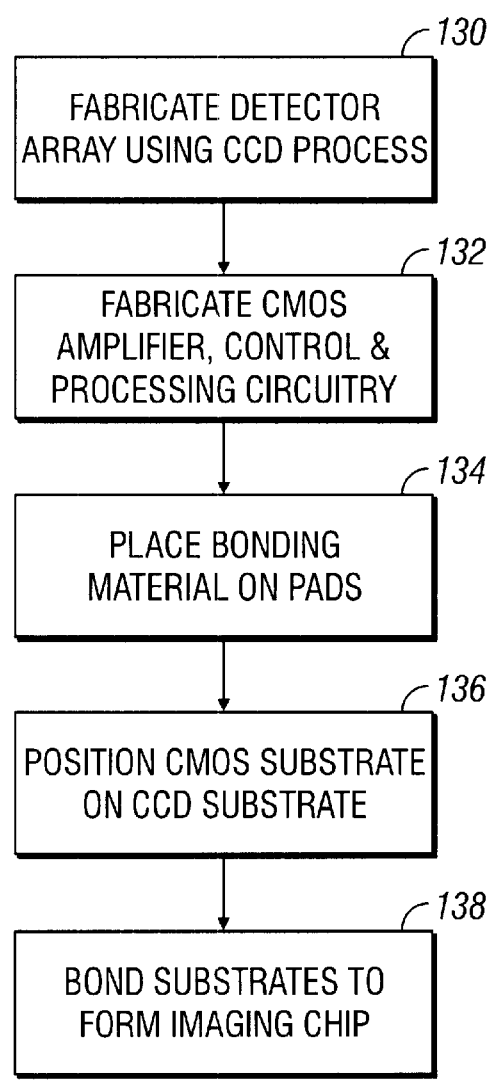
FIG. 3 is a flow chart of a process for fabricating a hybrid radiation imaging chip using both CCD and CMOS processes.

FIG. 3 illustrates an overview of a technique for fabricating the hybrid imaging chip 100. The imaging array is formed on one substrate using a conventional CCD fabrication process, such as the buried channel and peristaltic CCD fabrication processes (step 130). Likewise, the charge-mode amplifier, the signal processing circuitry, and the timing and control circuitry are formed on another substrate using a conventional CMOS fabrication process (step 132). Bonding pads are formed on each substrate during these fabrication processes. The fabrication processes are optimized individually to produce circuits capable of the highest performance quality.

Once the substrates have been fabricated, a bonding material is placed on the bonding pads (step 134), and the CMOS substrate is positioned on the CCD substrate (step 136). The two substrates are then bonded together using any of a variety of techniques (step 138). Examples of such techniques include conventional bump-bonding techniques.

Figure 4:
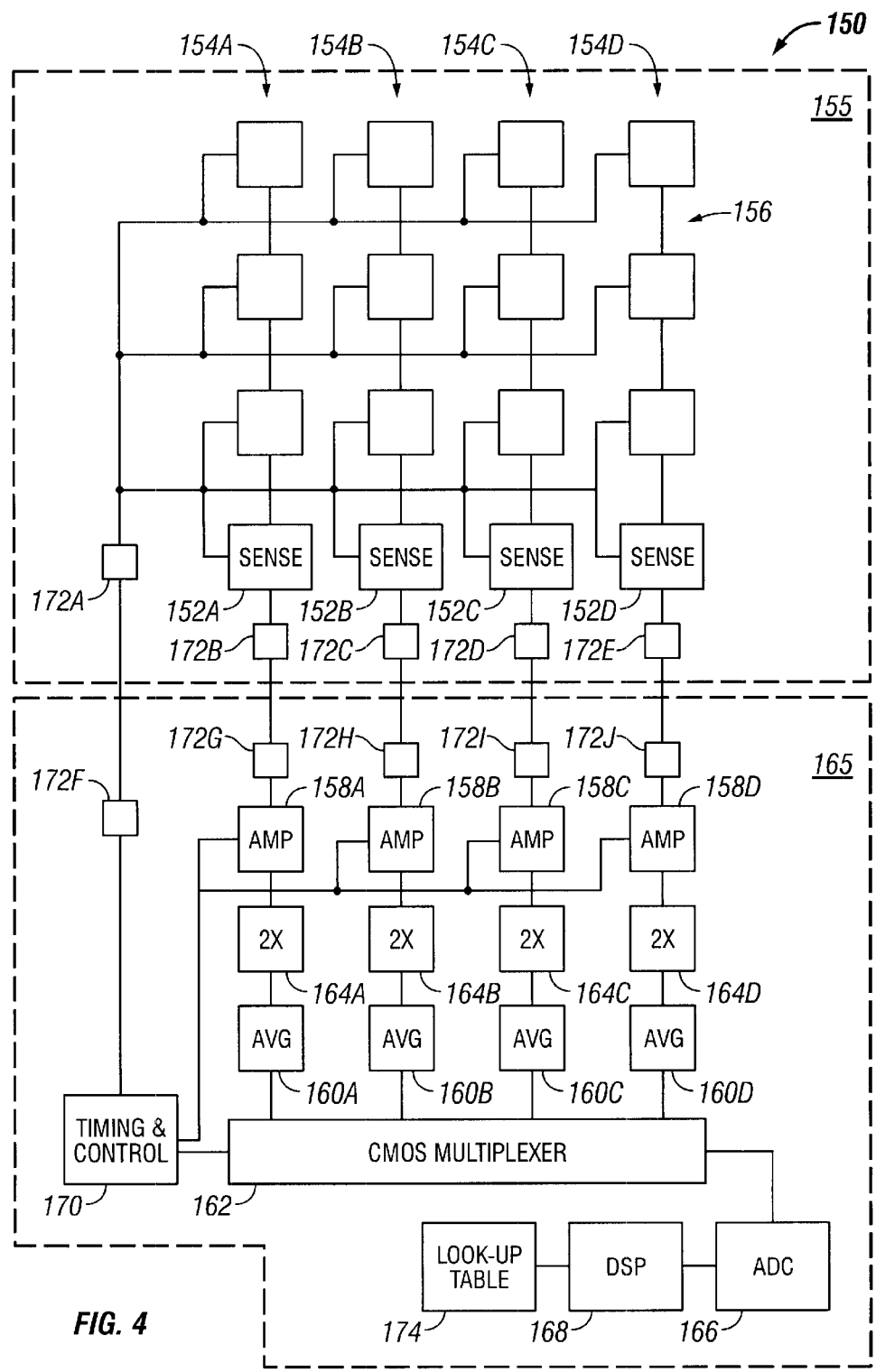
FIG. 4 is a schematic diagram of another hybrid radiation imaging chip that includes both CCD and CMOS components.

FIG. 4 shows another structure for a hybrid CCD-CMOS imaging chip 150. This imaging chip 150 includes a non-destructive sense node 152A–D, implemented in this example as a floating polysilicon gate, for each line 154A–D in the CCD array 156. These sense nodes 152A–D replace the usual high-speed serial register. The non-destructive sense nodes 152A–D are typically formed on the CCD substrate 155 and operate as described below.

The imaging chip 150 includes CMOS charge-mode amplifiers 158A–D formed on the CMOS substrate 165. Each is coupled to one of the non-destructive sense nodes 152A–D. Each of the amplifiers 158A–D also is coupled to a corresponding averaging circuit 160A–D. In many implementations, a double-sampling circuit 164A–D is formed between each pair of amplifiers 158A–D and averaging circuits 160A–D.

A high-speed CMOS multiplexer 162 receives voltage-mode signals from the averaging circuits 160A–D and delivers a single signal to an analog-to-digital converter (ADC) 166. The ADC 166 digitizes the signal and delivers it to a digital signal processor (DSP) 168. A look-up table 174 is stored in a storage device, such as a writable read-only memory (ROM) device, for use by the DSP 168, as described below.

A timing and control circuit 170 on the CMOS substrate 165 delivers control signals to the CCD array 156, the non-destructive sense nodes 152A–D, the averaging circuits 160A–D, and the CMOS multiplexer 162. Optional bonding pads 172A–J are formed on the CCD and CMOS substrates 155, 165 to allow mechanical and electrical interconnection between the substrates.

The non-destructive sense nodes 152A–D, the CMOS amplifiers 158A–D, and the averaging circuits 160A–D together provide parallel channels for converting the charge collected in each of the lines 154A–D of the CCD array 156. In general, the CCD array 156 is capable of transferring charge at a rate much higher than that required in scientific applications. For example, a typical application might require transferring data from a 128×128 array to the signal processing circuitry at an effective rate of 10 frames per second, or 1.28 kHz per line. A typical CCD array, however, can support a much higher line transfer rate, e.g., 128 kHz. Therefore, the CCD array 156 in this example can support 100 samples from each detector in the array 156 between each transfer to the digital signal processor 168.

Since the sense nodes 152A–D are non-destructive, the charge in those nodes can be repeatedly measured. The averaging circuits 160A–D connected to the CMOS amplifiers 158A–D average or accumulate the samples measured during successive sampling periods of, for example, 100 samples. At the end of each sampling period, the averaging circuits 160A–D deliver the stored charge to the high-speed multiplexer 162.

This type of parallel charge measurement reduces readout noise by a factor approximately equivalent to the square root of the number of samples taken for each pixel. For a 128×128 array operating at a transfer rate of 10 frames per second, readout noise is reduced from approximately 4 electrons rms to approximately 0.4 electrons rms.

Figure 5:
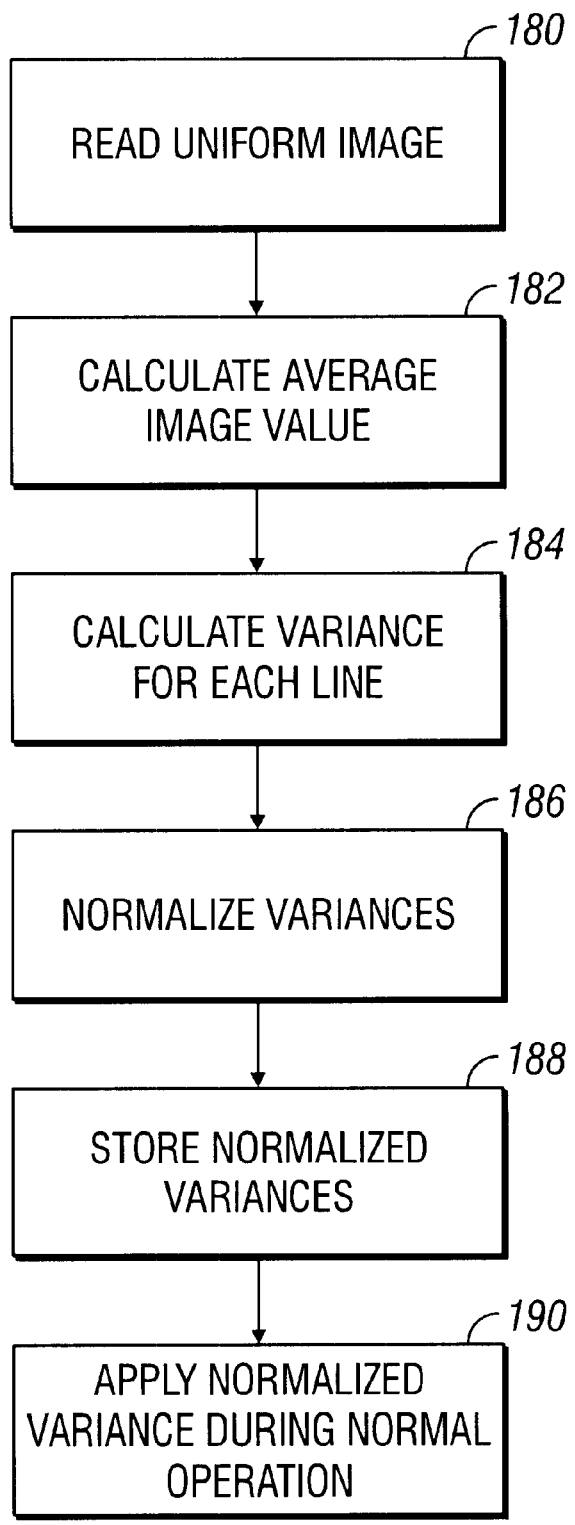
FIG. 5 is a flow chart of a process for calibrating a hybrid imaging chip.

FIG. 5 illustrates a technique for use in calibrating the parallel hybrid imaging chip 150 of FIG. 4 to improve image quality. In general, this technique allows for correction of column-to-column offset and gain variations that often result from minor differences in CMOS amplifier geometries. This technique is carried out in the digital signal processor 168 (FIG. 4) or in other processing circuitry, such as a programmable processor, in the imaging chip or another chip.

The signal processing circuitry first reads all or a portion of a uniform image, such as a dark current generated by pixels in an optically opaque portion of the imaging field (step 180). The DSP or other processing circuitry calculates an average image value in the uniform image (step 182). For each line in the array, a variance between the measured charge and the average value is calculated (step 184). The processing circuitry normalizes the variances (step 186). The normalized variances represent the amount of gain variation among the CMOS amplifiers. These normalized variances are stored in the look-up table described above (step 188).

The processing circuitry retrieves and applies the normalized variances during normal operation of the imaging chip (step 190). In general, applying the normalized variances involves multiplying the values stored in the look-up table with the real-time measurements of corresponding pixels in the array. Normalizing the measured values in this manner eliminates the effects of gain variations among the amplifiers.

The invention has been described in terms of particular embodiments. Various modifications can be made without departing from the spirit and scope of the invention. For example, while the invention has been described in terms of photon detection and imaging, it is also useful in detecting and imaging other types of radiation, including charged particles. Also, the imaging circuit often varies among implementations. For example, some implementations do not include dedicated averaging circuits for each line of the array, but rather implement the averaging function in the digital signal processor 168 (FIG. 4). Likewise, other types of capacitively coupled detectors, such as "bucket-brigade" detectors implemented with bipolar junction transistors, can be used. Also, while electrical connection between the substrates is described, other forms of signal coupling, such as optical coupling, is contemplated. Accordingly, other embodiments are within the scope of the following claims.

What is claimed is:

1. A radiation imaging device comprising:
   a first substrate having:
      an array of charge-coupled detectors (CCDs); and
      a serial output register coupled electrically to the CCDs in the array; and
   a second substrate bonded mechanically to the first substrate and having:
      a complementary metal-oxide semiconductor (CMOS) charge-converting amplifier coupled electrically to the serial output register to convert charge collected in the CCDs into a voltage-mode signal;
      CMOS processing circuitry coupled to receive the voltage-mode signal from the charge-converting amplifier and to change some aspect of the voltage-mode signal; and
      CMOS timing and control circuitry coupled electrically to the CCDs to control charge transfer from the CCDs to the charge-converting amplifier.

2. A radiation imaging device comprising:
   a first substrate having:
      an array of charge-coupled detectors (CCDs) arranged into parallel lines; and
      for each of the lines in the array, a non-destructive sense node coupled to the CCDs in the line and configured to sense charge collected by the CCDs in the line; and
   a second substrate bonded mechanically to the first substrate and having:
      for each of the lines in the array, a complementary metal-oxide semiconductor (CMOS) averaging circuit coupled to the sense node and configured to average an amount of charge collected by each of the CCDs in the line at multiple sampling instants;
      for each of the lines in the array, a CMOS charge-converting amplifier coupled to the averaging circuit and configured to convert, for each of the CCDs in the line, the charge collected by the CCD over the multiple sampling instants into a voltage-mode signal;
      a CMOS multiplexer connected to receive the voltage-mode signal from each charge-converting amplifier;
      CMOS image processing circuitry coupled to receive the voltage-mode signal from the multiplexer; and
      CMOS timing and control circuitry coupled to the CCDs in the array and configured to control charge transfer from the CCDs.

3. A method comprising:
   detecting incoming radiation with an array of detectors formed on a first substrate;
   delivering a charge-mode signal generated by the detector array in response to the radiation from the first substrate to a second substrate; and
   converting the charge-mode signal into a voltage-mode signal, using an amplifier formed on the second substrate.

4. The method of claim 3, further comprising delivering charge from the detector array to the serial register on the first substrate.

5. The method of claim 4, when delivering the charge-mode signal from the first substrate to the second substrate includes delivering the charge-mode signal from the serial register to a charge-mode amplifier on the second substrate.

6. The method of claim 3, wherein delivering the charge-mode signal includes delivering charge from each line of detectors in the array to a corresponding charge-mode amplifier on the second substrate.

7. The method of claim 6, further comprising delivering a voltage-mode signal from each charge-mode amplifier to an averaging circuit on the second substrate.

8. The method of claim 6, wherein delivering charge from each line of detectors includes sensing charge from each line of detectors at a corresponding non-destructive sense node.

9. The method of claim 3, further comprising delivering timing and control signals from the second substrate to the detector array.

10. A device as in claim 1, wherein said output nodes are non destructive sense nodes which can be read out a plurality of times for the same information while retaining the same value therein.

11. A device as in claim 10, further comprising an averaging circuit, receiving a plurality of values representing the same information about the same image, and providing an averaged version of said plurality of values.

* * * * *